United States Patent
Jeon et al.

[11] Patent Number: 5,828,906
[45] Date of Patent: Oct. 27, 1998

[54] SYSTEM FOR SEQUENTIALLY SHIFTING BITS FROM THE NEXT ONE OF THE MOST SIGNIFICANT BIT AND THEN OUTPUTTING THE MOST SIGNIFICANT BIT ACCORDING A SELECTION SIGNAL

[75] Inventors: Joon Hyeon Jeon; Gee Ho Jeon, both of Seoul, Rep. of Korea

[73] Assignee: Korea Telecommunication Authority, Seoul, Rep. of Korea

[21] Appl. No.: 664,172

[22] Filed: Jun. 14, 1996

[30] Foreign Application Priority Data

Jun. 15, 1995 [KR] Rep. of Korea .................. 1995 15901

[51] Int. Cl.[6] ........................................ G06F 3/00
[52] U.S. Cl. .............................. 395/885; 341/67; 341/101
[58] Field of Search ........................... 341/67, 101, 106; 364/926, 939.5; 365/189.12; 371/37.6; 395/885

[56] References Cited

U.S. PATENT DOCUMENTS

| | | | |
|---|---|---|---|
| 3,765,013 | 10/1973 | Leibowitz | 341/89 |
| 5,166,684 | 11/1992 | Juri et al. | 341/67 |
| 5,307,061 | 4/1994 | Suzuki | 341/93 |
| 5,436,626 | 7/1995 | Fujiwara et al. | 341/67 |
| 5,654,707 | 8/1997 | Matsumoto | 341/101 |
| 5,682,156 | 10/1997 | Suda | 341/67 |

*Primary Examiner*—Thomas C. Lee
*Assistant Examiner*—Anderson I. Chen
*Attorney, Agent, or Firm*—Merchant, Gould, Smith, Edell, Welter & Schmidt, P.A.

[57] ABSTRACT

A parallel input/serial output device for inputting code bits in parallel and outputting the same in serial in a variable-length encoder divides a bit word into one with a sign bit and without a sign bit in a table for a variable-length encoder, sequentially stores the absolute values in the table in case of the bit word with a sign bit, sequentially stores the remaining bits with the most significant bit being stored finally in case of those with a sign bit, sequentially outputs bits from the next one of the most significant bit in serial and outputs the most significant bit as the last bit if the counted value becomes one. Therefore, the size of an internal conversion table can be decreased to a half, thereby reducing the number of used elements. Accordingly, the size of an address decoder can be reduced to a half and the operational speed can be improved.

4 Claims, 2 Drawing Sheets

SYSTEM FOR SEQUENTIALLY SHIFTING BITS FROM THE NEXT ONE OF THE MOST SIGNIFICANT BIT AND THEN OUTPUTTING THE MOST SIGNIFICANT BIT ACCORDING A SELECTION SIGNAL

BACKGROUND OF THE INVENTION

The present invention relates to a parallel input/serial output device for inputting code bits in parallel and outputting the corresponding variable length codes (VLC) in serial in a variable-length encoder, and a method thereof.

A variable-length encoder used in transmitting a moving picture with a low bit rate has necessity of a simplicity and compactness in its hardware implementation.

In general, during transmission of code bits, the outputs of an motion estimator have the code bits positioned foremost, which are all converted into a VLC table.

Therefore, since performance of parallel input/serial output device is mainly dependent on the size of the VLC table, a lengthy table makes operation speed decreased.

SUMMARY OF THE INVENTION

To solve the above problems, it is an object of the present invention to provide a parallel input/serial output device and method thereof, by dividing bit words into ones with a sign bit and without a sign bit in a table for a variable-length encoder, sequentially storing the absolute values in the table in case of the bit words with a sign bit, sequentially storing the remaining bits with the most significant bit being stored finally in case of those with a sign bit, sequentially outputting bits from the next one of the most significant bit in serial and outputting the most significant bit as the last bit if the counted value becomes one.

To accomplish the above object, there is provided a parallel input/serial output device comprising: latching means for receiving the most significant bit word externally, latching and outputting the same; a plurality of shifting means for receiving bit words except the most significant bit word externally in parallel, sequentially shifting and outputting bits from the next one of the most significant bit; counting means for receiving a bit word length externally, counting the same and outputting a selection signal if the counted value becomes a predetermined value; and multiplexing means for receiving the outputs of the shifting means and outputting the same in serial and outputting the outputs of the latching means according to the selection signal of the counting means.

Also, to accomplish the above object, there is provided a method adopted for the parallel input/serial output device comprising the steps of: receiving bit words and determining whether there is a sign bit in the bit words (step 1); if it is determined in the step 1 that there is a sign bit in the bit words, rearranging the least significant bit of the word as the most significant bit and sequentially storing the remaining bits except the most significant bit with the most significant bit being stored finally (step 2); if it is determined in the step 1 that there is no sign bit in the bit words, arranging the sign bit as the most significant bit and then sequentially absolute values are sequentially stored in the table without rearranging the words (step 3); and sequentially shifting bits from the next one of the most significant bit, outputting the same in serial and then outputting the most significant bit according to a selection signal if the counted value becomes a predetermined value (step 4).

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
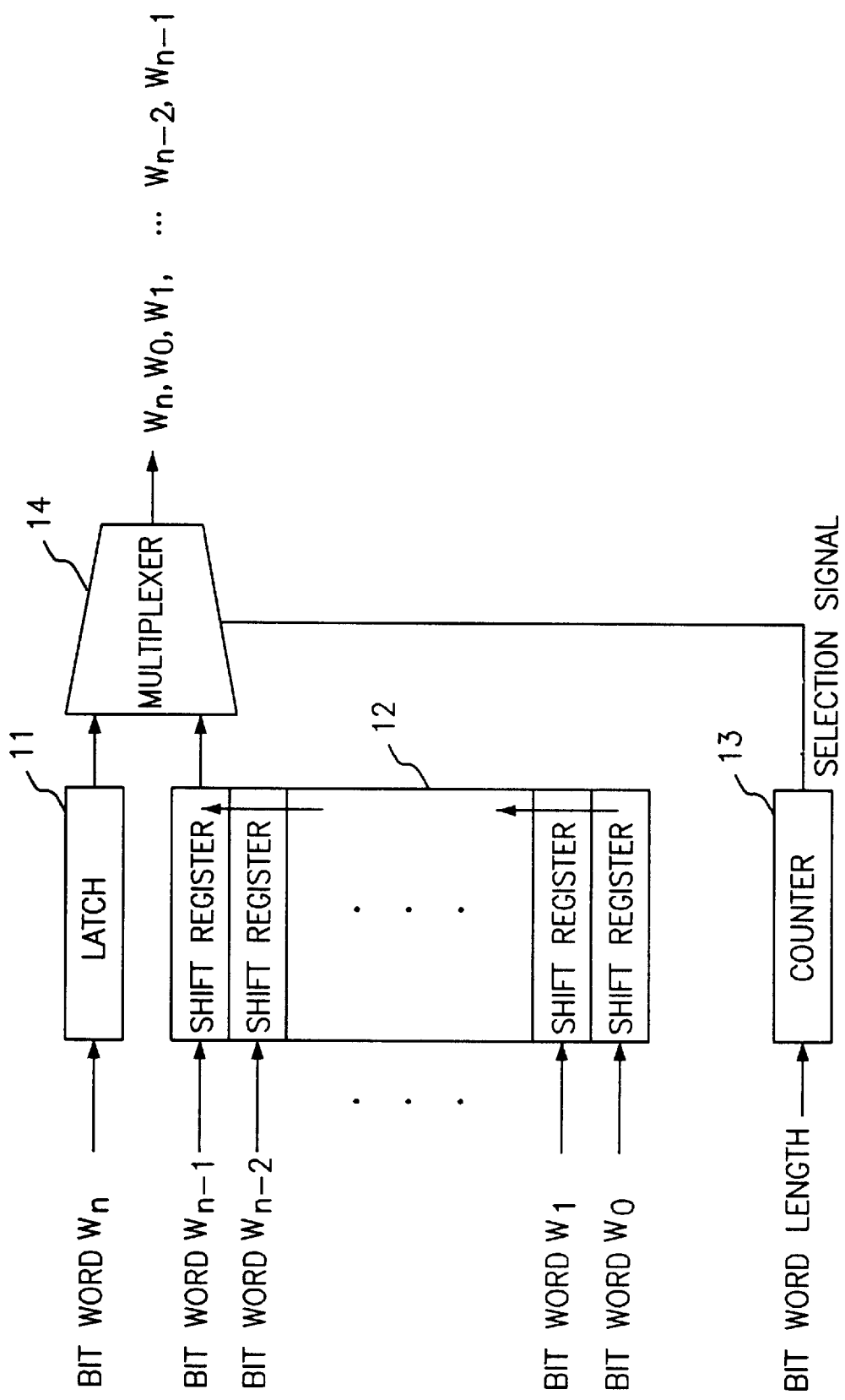
FIG. 1 is a block diagram of a parallel input/serial output device according to the present invention.

In FIG. 1, reference numeral 11 represents a latch, reference numeral 12 represents a shift register, reference numeral 13 represents a counter, and reference numeral 14 represents a multiplexer.

The parallel input/serial output device includes the latch 11 for receiving and latching the variable-length coded most significant bit word $W_n$ externally and outputting the same to the multiplexer 14, a plurality of the shift registers 12 receiving the variable-length coded most significant bit words $W_{n-1}$ through $W_0$ externally in parallel, except the most significant bit word $W_n$, sequentially shifting the same and outputting bits from the next one of the most significant bit to the multiplexer 14, the counter 13 for receiving bit word lengths externally, counting the same and outputting a selection signal to the multiplexer 14 if the counted value becomes one, and a multiplexer 14 for receiving outputs of the shift registers 12, outputting the same externally and then outputting outputs of the latch 11 externally according to the selection signal of the counter 13.

Figure 2:
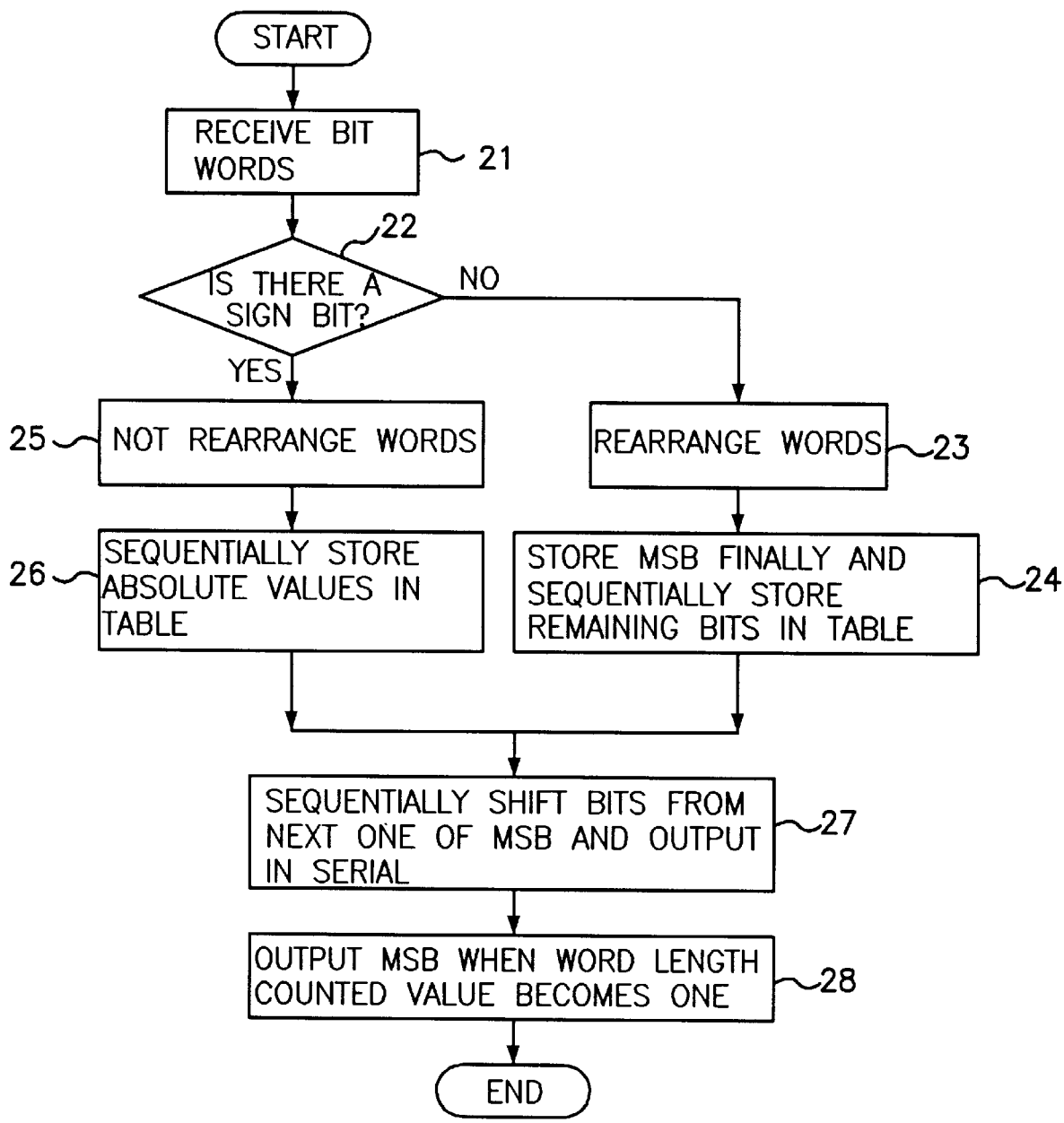
FIG. 2 is a flowchart of a parallel input/serial output method according to the present invention.

FIG. 2 is a flowchart of a parallel input/serial output method according to the present invention.

First, variable-length coded bit words are received (step 21) and it is determined whether each bit word has a sign bit (step 22).

If there is no sign bit in the bit word, the least significant bit of the word is rearranged as the last one (step 23) and the remaining bits are sequentially stored in the table (step 24).

For example, in case of a 5-bit word, the sequence of D4-D3-D2-D1-D0 is rearranged as that of D0-D4-D3-D2-D1, i.e., W4-W3-W2-W1-W0.

If there is a sign bit in the bit word, the word is not rearranged, but the sign bit is arranged as the most significant bit (step 25) and only the absolute values are sequentially stored in the table (step 26), that is, S-D3-D2-D1-D0 (W4-W3-W2-W1-W0).

Then, bits from the next one of the most significant bit ($W_n$) are sequentially shifted to then be output in serial (step 27), i.e., W3→W2→W1→W0.

If the counted value of the word length becomes one, the most significant bit i.e., W4, as the last serial bit is output according to the selection signal.

As described above, according to the present invention, the size of an internal conversion table can be decreased to a half, thereby reducing the number of used elements. Accordingly, the size of an address decoder can be reduced to a half and the operational speed can be improved.

What is claimed is:

1. A parallel input/serial output device comprising:

latching means for receiving the most significant bit word externally, latching and outputting the same;

a plurality of shifting means for receiving bit words except the most significant bit word externally in parallel, sequentially shifting and outputting bits from the next one of the most significant bit;

counting means for receiving a bit word length externally, counting the same and outputting a selection signal if said counted value becomes a predetermined value; and multiplexing means for receiving the outputs of said shifting means and outputting the same in serial and outputting the outputs of said latching means according to said selection signal of said counting means.

2. A parallel input/serial output device as claimed in claim 1, wherein said counting means outputs a selection signal when a counted value becomes one.

3. A parallel input/serial output method comprising the steps of:

receiving bit words and determining whether there is a sign bit in said bit words (step 1);

if it is determined in said step 1 that there is a sign bit in said bit words, rearranging the least significant bit of said word as the most significant bit and sequentially storing the remaining bits except the most significant bit with the most significant bit being stored finally (step 2);

if it is determined in said step 1 that there is no sign bit in said bit words, arranging said sign bit as the most significant bit and then sequentially absolute values are sequentially stored in the table without rearranging said words (step 3); and sequentially shifting bits from the next one of the most significant bit, outputting the same in serial and then outputting the most significant bit according to a selection signal if said counted value becomes a predetermined value (step 4).

4. A parallel input/serial output method as claimed in claim 3, wherein said predetermined value in said fourth step is one.

\* \* \* \* \*